United States Patent
Yang et al.

(10) Patent No.: US 9,425,744 B2
(45) Date of Patent: Aug. 23, 2016

(54) MULTI MODE BIAS MODULATOR OPERATING IN ENVELOPE TRACKING MODE OR AVERAGE POWER TRACKING MODE AND ENVELOPE TRACKING POWER AMPLIFIER USING THE SAME

(71) Applicant: Research & Business Foundation SUNGKYUNKWAN UNIVERSITY, Suwon-si (KR)

(72) Inventors: Youngoo Yang, Hwaseong-si (KR); Junghyun Ham, Suwon-si (KR); Hearyun Jung, Seoul (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 1 day.

(21) Appl. No.: 14/625,653

(22) Filed: Feb. 19, 2015

(65) Prior Publication Data

US 2015/0236652 A1    Aug. 20, 2015

(30) Foreign Application Priority Data

Feb. 19, 2014    (KR) .................... 10-2014-0019119

(51) Int. Cl.
| | |
|---|---|
| H03G 3/20 | (2006.01) |
| H03F 1/02 | (2006.01) |
| H03F 3/19 | (2006.01) |
| H03F 3/21 | (2006.01) |

(Continued)

(52) U.S. Cl.
CPC ............ *H03F 1/0205* (2013.01); *H03F 1/0227* (2013.01); *H03F 3/19* (2013.01); *H03F 3/211* (2013.01); *H03F 3/217* (2013.01); *H03F 1/0211* (2013.01); *H03F 1/0222* (2013.01); *H03F 1/305* (2013.01); *H03F 2200/102* (2013.01); *H03F 2200/451* (2013.01); *H03F 2200/507* (2013.01); *H03F 2203/21127* (2013.01); *H03G 3/20* (2013.01)

(58) Field of Classification Search
CPC ... H03F 1/0205; H03F 3/2173; H03F 1/0266; H03F 1/0277; H03F 3/24; H03F 3/3028; H03F 3/72; H03F 3/19; H03F 3/211; H03F 3/217; H03F 3/2171; H03F 2203/21127; H03F 2200/432; H03F 2203/7215
USPC .................................. 330/127, 136, 297, 285
See application file for complete search history.

(56) References Cited

U.S. PATENT DOCUMENTS

| | | | | |
|---|---|---|---|---|
| 7,808,323 | B2 * | 10/2010 | Takinami ................ | G05F 1/565 330/297 |
| 8,237,499 | B2 * | 8/2012 | Chen ..................... | H03F 1/0266 330/136 |
| 8,508,297 | B2 * | 8/2013 | Honda .................. | H03F 1/0222 330/136 |

(Continued)

*Primary Examiner* — Khanh V Nguyen
(74) *Attorney, Agent, or Firm* — NSIP Law

(57) ABSTRACT

A multi-mode bias modulator operating in envelope tracking mode or average power tracking mode and an envelope tracking power amplifier using the same are disclosed. The envelope tracking power amplifier includes a multi-mode bias modulator and a power amplifier. The multi-mode bias modulator generates a variable bias voltage using a linear amplifier and a switching amplifier operating in envelope tracking mode or average power tracking mode in accordance with an operation mode control signal that determines any one of envelope tracking mode and average power tracking mode. The power amplifier is biased in response to the variable bias voltage, power-amplifies a radio frequency (RF) signal, and outputs the amplified RF signal to an antenna.

14 Claims, 6 Drawing Sheets

(51) Int. Cl.
*H03F 3/217* (2006.01)
*H03F 1/30* (2006.01)

(56) References Cited

U.S. PATENT DOCUMENTS

| | | | | |
|---|---|---|---|---|
| 8,633,768 B2 * | 1/2014 | Takahashi | ............ | H03F 1/0222 330/10 |
| 8,698,558 B2 * | 4/2014 | Mathe | ................... | H03F 1/0227 330/136 |
| 8,766,716 B2 * | 7/2014 | Paek | ..................... | H03F 3/2178 330/136 |
| 8,975,960 B2 * | 3/2015 | Strange | ................. | H03F 1/0222 330/136 |
| 2012/0229213 A1 * | 9/2012 | Takahashi | ............. | H03F 3/2173 330/297 |
| 2013/0194037 A1 * | 8/2013 | Takahashi | ................. | H03F 1/32 330/3 |

* cited by examiner

MULTI MODE BIAS MODULATOR OPERATING IN ENVELOPE TRACKING MODE OR AVERAGE POWER TRACKING MODE AND ENVELOPE TRACKING POWER AMPLIFIER USING THE SAME

CROSS-REFERENCE TO RELATED APPLICATION

This application claims the benefit under 35 U.S.C. 119(a) of Korean Patent Application No. 10-2014-0019119, filed on Feb. 19, 2014, in the Korean Intellectual Property Office, the entire disclosures of which are incorporated herein by reference for all purposes.

BACKGROUND

1. Technical Field

The present invention relates generally to a power amplifier, and, more particularly, to an envelope tracking power amplifier 2. Description of the Related Art Recent wireless communication systems utilize a modulation method having a high peak to average power ratio (PAPR), such as orthogonal frequency division multiplexing (OFDM), in order to process a large amount of data while efficiently utilizing limited frequency resources.

In a modulation method having a high PAPR, a high-efficiency power amplifier, such as a class C, D, E or F power amplifier, may be used as a power amplifier (PA) in order to maximize efficiency. Although these power amplifiers can operate with high efficiency in a compression region, i.e., in a saturation region, they require an additional linearization technique due to the non-linearity of the compression region and do not significantly improve efficiency in terms of an overall system.

Furthermore, these power amplifiers operate with high efficiency in the saturation region, but have poor efficiency in a back-off region lower than a maximum power point. Wireless communication systems operate in the back-off region lower than the PAPR during most of their operating time, thus resulting in poor efficiency in average power.

In order to solve these problems, there have been proposed an envelope tracking (ET) power amplification method of applying a bias, having a voltage level modulated in response to the envelope of an RF input signal, and the RF input signal to a linear mode power amplifier, rather than applying a fixed bias to the linear mode power amplifier, and an envelope elimination and restoration (EER) power amplification method of applying an input signal, including only a phase component left by removing an envelope using a bias, modulated according to the envelope, and a limiter, to a switching mode power amplifier.

Although the ET power amplification method has slightly lower efficiency than the EER power amplification method, it is advantageous in that a reduction in linearity is smaller despite timing mismatch that is inevitable between the RF input signal path of the power amplifier and the path of a modulated bias path and also in that the structure of the bias modulator is simpler.

Moreover, through the combination of the EER power amplification method and the ET power amplification method, there has been proposed hybrid ET power amplification method of applying a bias, having a voltage level modulated in response to an envelope, and an RF input signal to a switching mode power amplifier.

In the hybrid ET power amplification method, a bias modulator can achieve a high-speed operation and high efficiency using a linear amplifier providing a wide bandwidth and a switching amplifier having high efficiency in order to generate a modulated bias voltage based on a detected envelope.

In general, the overall efficiency of the bias modulator is determined based on bias voltage, output to the power amplifier, and load resistance because it increases or decreases in proportion to output power. In other words, when an output bias voltage modulated by the bias modulator is low because the size of an envelope is small, the power efficiency of the bias modulator is also low.

In order to overcome this problem, a DC-DC converter is added. When an output bias voltage is low, an operating voltage for the linear amplifier is lowered using the DC-DC converter, thereby being able to improve the efficiency of the bias modulator. However, this method is problematic in that the linear amplifier should be designed to operate desirably at all different operating voltages and both a circuit size and power consumption are increased due to the added DC-DC converter.

As a result, there is a need for a method for improving the efficiency of a bias modulator in a wide power region without additionally using analog circuits that require a relatively large area.

SUMMARY

At least some embodiments of the present invention are directed to the provision of a multi-mode bias modulator and an envelope tracking power amplifier using the same.

At least some embodiments of the present invention are directed to the provision of a multi-mode bias modulator capable of improving efficiency in a wide power region and an envelope tracking power amplifier using the same.

At least some embodiments of the present invention are directed to the provision of a multi-mode bias modulator capable of improving efficiency even at lower output power while minimizing the complexity of a circuit and an envelope tracking power amplifier using the same.

In accordance with an aspect of the present invention, there is provided an envelope tracking power amplifier, including a multi-mode bias modulator configured to generate a variable bias voltage using a linear amplifier and a switching amplifier operating in envelope tracking mode or average power tracking mode in accordance with an operation mode control signal that determines any one of envelope tracking mode and average power tracking mode; and a power amplifier configured to be biased in response to the variable bias voltage, and to power amplify a radio frequency (RF) signal and output the amplified RF signal to an antenna; wherein the multi-mode bias modulator, during operation in envelope tracking mode, drives a linear amplification bias current corresponding to an alternating current (AC) component of an envelope signal using the linear amplifier, drives a switching amplification bias current corresponding to a direct current (DC) component of the envelope signal using the switching amplifier, and generates the variable bias current by combining the linear amplification bias current with the switching amplification bias current, and, during operation in average power tracking mode, generates the variable bias current by driving a switching amplification bias current following a predetermined reference voltage using the switching amplifier; and wherein the variable bias voltage is related to an output resistance of the multi-mode bias modulator, an input resistance of the power amplifier, and the variable bias current.

The operation mode control signal may be determined based on an average output power setting value, and the operation mode control signal may be determined to be the average power tracking mode when the average output power setting value is relatively low and to be the envelope tracking mode when the average output power setting value is relatively high.

When operation mode is envelope tracking mode in accordance with the operation mode control signal, the linear amplifier of the multi-mode bias modulator may be operated to drive the linear amplification bias current using an operation amplifier that linearly amplifies the AC component of the envelope signal, and the switching amplifier of the multi-mode bias modulator may be operated to drive the switching amplification bias current using a switching amplification stage that is switched in accordance with a duty ratio determined based on a magnitude of the DC component of the envelope signal; and when the operation mode is average power tracking mode in accordance with the operation mode control signal, the linear amplifier of the multi-mode bias modulator may be operated to be inactivated, and the multi-mode bias modulator of the switching amplifier may be operated to drive the switching amplification bias current using the switching amplification stage that is switched in accordance with a duty ratio determined based on an error between the variable bias voltage, output by the multi-mode bias modulator, and a predetermined reference voltage.

The envelope tracking power amplifier may further include an operation mode determination unit configured to detect a level of the variable bias voltage output by the multi-mode bias modulator, to determine any one of average power tracking mode and envelope tracking mode based on a result of comparison between the detected level of the variable bias voltage and a predetermined mode determination reference voltage, and to generate the operation mode control signal. The operation mode determination unit may be operated to detect the level of the variable bias voltage output by the multi-mode bias modulator, to determine any one of average power tracking mode and envelope tracking mode based on a result of comparison between the detected level of the variable bias voltage and a predetermined mode determination reference hysteresis range, and to generate the operation mode control signal.

In accordance with another aspect of the present invention, there is provided an envelope tracking power amplifier, including a multi-mode bias modulator configured to generate a variable bias voltage using a linear amplifier and switching amplifiers operating in envelope tracking mode or average power tracking mode in accordance with an operation mode control signal that determines any one of envelope tracking mode and average power tracking mode; and a power amplifier configured to be biased in response to the variable bias voltage, and to power amplify an radio frequency (RF) signal and output the amplified RF signal to an antenna; wherein the multi-mode bias modulator includes a linear amplifier configured to drive a linear amplification bias current in accordance with an AC component of an envelope signal in envelope tracking mode, and to be inactivated in average power tracking mode; a first switching amplifier configured to drive a first switching amplification bias current in accordance with a duty ratio determined based on a magnitude of a DC component of the envelope signal in envelope tracking mode, and to be inactivated in average power tracking mode; and a second switching amplifier configured to be inactivated in envelope tracking mode, and to drive a second switching amplification bias current in accordance with a duty ratio corresponding to an error between an output variable bias voltage and a predetermined reference voltage in average power tracking mode; wherein the multi-mode bias modulator is operated to, during operation in envelope tracking mode, generate the variable bias current by combining the linear amplification bias current output by the linear amplifier with the first switching amplification bias current output by the first switching amplifier and, during operation in average power tracking mode, generate the variable bias current as the second switching amplification bias that is current driven by the second switching amplifier; and wherein the variable bias voltage is related to an output resistance of the multi-mode bias modulator, an input resistance of the power amplifier, and the variable bias current.

In accordance with still another aspect of the present invention, there is provided an envelope tracking power amplifier, including a multi-mode bias modulator configured to generate a variable bias voltage using a linear amplifier and a switching amplifier operating in envelope tracking mode or average power tracking mode in accordance with an operation mode control signal that determines any one of envelope tracking mode and average power tracking mode; and a power amplifier configured to be biased in response to the variable bias voltage, and to power amplify an radio frequency (RF) signal and output the amplified RF signal to an antenna; wherein the multi-mode bias modulator includes a linear amplifier configured to drive a linear amplification bias current in accordance with an AC component of an envelope signal in envelope tracking mode, and to be inactivated in average power tracking mode; and a switching amplifier configured to drive a first switching amplification bias current corresponding to a DC component of the envelope signal in envelope tracking mode, and to drive a second switching amplification bias current in accordance with a duty ratio corresponding to a magnitude of an error between an output variable bias voltage and a predetermined reference voltage in average power tracking mode; wherein the multi-mode bias modulator is operated to, during operation in envelope tracking mode, generate the variable bias current by combining the linear amplification bias current driven by the linear amplifier with the first switching amplification bias current driven by the switching amplifier and, during operation in average power tracking mode, generate the variable bias current as the second switching amplification bias current that is driven by the switching amplifier; and wherein the variable bias voltage is related to an output resistance of the multi-mode bias modulator, an input resistance of the power amplifier, and the variable bias current.

The switching amplifier may include a first comparator, a shooting current prevention and driving circuit unit, a switching amplification stage, an inductor, an error amplifier, a switch, a capacitor, and a second comparator; and the switching amplifier is configured such that in accordance with the operation mode control signal, during operation in envelope tracking mode, an open loop, including the first comparator, the shooting current prevention and driving circuit unit, the switching amplification stage and the inductor, is activated and also the capacitor is separated from the inductor by the switch, thereby outputting the first switching amplification bias current, and, during operation in average power tracking mode, a closed loop, including the error amplifier, the second comparator, the shooting current prevention and driving circuit unit, the switching amplification stage and the inductor, is activated and also the capacitor is connected to a contact between the inductor and the error amplifier by the switch, thereby driving the second switching amplification bias current.

The switching amplifier may be operated such that during operation in envelope tracking mode, a comparison signal of the first comparator that compares a switching input signal of the linear amplifier with a reference voltage is applied to the shooting current prevention and driving circuit unit, and, during operation in average power tracking mode, an error output is output by the error amplifier that amplifies the error between the variable bias voltage and the reference voltage and a PWM signal of the second comparator that compares the error output with a ramp signal is applied to the shooting current prevention and driving circuit unit; and the switching input signal is a class AB buffer output voltage attributable to a differential output signal pair of an operation amplifier of the linear amplifier.

The switching amplifier may include a first multiplexer and a second multiplexer that operate in accordance with the operation mode control signal; the first multiplexer may be operated to receive the ramp signal and the reference voltage, and to, during operation in envelope tracking mode, select the reference voltage and then apply the reference voltage to the first comparator and, during operation in average power tracking mode, select the ramp signal and then apply the ramp signal to the second comparator; and the second multiplexer may be operated to, during operation in envelope tracking mode, apply the comparison signal, output by the first comparator, to the shooting current prevention and driving circuit unit and, during operation in average power tracking mode, apply the PWM signal, output by the second comparator, to the shooting current prevention and driving circuit unit.

In accordance with still another aspect of the present invention, there is provided an envelope tracking power amplifier, including a multi-mode bias modulator configured to generate a variable bias voltage using a linear amplifier and a switching amplifier operating in envelope tracking mode or average power tracking mode in accordance with an operation mode control signal that determines any one of envelope tracking mode and average power tracking mode; and a power amplifier configured to be biased in response to the variable bias voltage, and to power amplify an radio frequency (RF) signal and output the amplified RF signal to an antenna; wherein the multi-mode bias modulator includes a linear amplifier configured to drive a linear amplification bias current in accordance with an AC component of an envelope signal in envelope tracking mode, and to be inactivated in average power tracking mode; and a switching amplifier configured to drive a first switching amplification bias current corresponding to a DC component of the envelope signal in envelope tracking mode, and to generate a second switching amplification bias current in accordance with a duty ratio corresponding to a magnitude of an error between an output variable bias voltage and a predetermined reference voltage in average power tracking mode; wherein the multi-mode bias modulator is operated to, during operation in envelope tracking mode, generate a variable bias current by combining the linear amplification bias current output by the linear amplifier with the first switching amplification bias current output by the switching amplifier and, during operation in average power tracking mode, generate a variable bias current as a second switching amplification bias current that is driven by the switching amplifier; and wherein the variable bias voltage is related to an output resistance of the multi-mode bias modulator, an input resistance of the power amplifier, and the variable bias current.

The switching amplifier may include a first comparator, a shooting current prevention and driving circuit unit, a switching amplification stage, an inductor, a switch, and a capacitor and second comparator; and the switching amplifier is configured such that in accordance with the operation mode control signal, during operation in envelope tracking mode, an open loop, including the first comparator, the shooting current prevention and driving circuit unit, the switching amplification stage and the inductor, is activated and also the capacitor is separated from the inductor by the switch, thereby outputting the first switching amplification bias current and, during operation in average power tracking mode, a closed loop, including the error amplifier, the second comparator, the shooting current prevention and driving circuit unit, the switching amplification stage and the inductor, is activated and also the capacitor is connected to a contact between the inductor and the error amplifier by the switch, thereby driving the second switching amplification bias current.

The switching amplifier may be operated such that during operation in envelope tracking mode, a first comparison signal of the first comparator that compares a switching input signal of the linear amplifier with a reference voltage is applied to the shooting current prevention and driving circuit unit and, during operation in average power tracking mode, a second comparison signal of the second comparator that compares the output variable bias voltage with a reference voltage is applied to the shooting current prevention and driving circuit unit; and the switching input signal may be a class AB buffer output voltage attributable to a differential output signal pair of an operation amplifier of the linear amplifier.

The switching amplifier may include a demultiplexer and a multiplexer that operate in accordance with the operation mode control signal; the demultiplexer may be operated to, during operation in envelope tracking mode, apply the reference voltage to the first comparator and, during operation in average power tracking mode, apply the reference voltage to the second comparator; and the multiplexer may be operated to, during operation in envelope tracking mode, apply the first comparison signal of the first comparator to the shooting current prevention and driving circuit unit and, during operation in average power tracking mode, apply the second comparison signal of the second comparator to the shooting current prevention and driving circuit unit.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
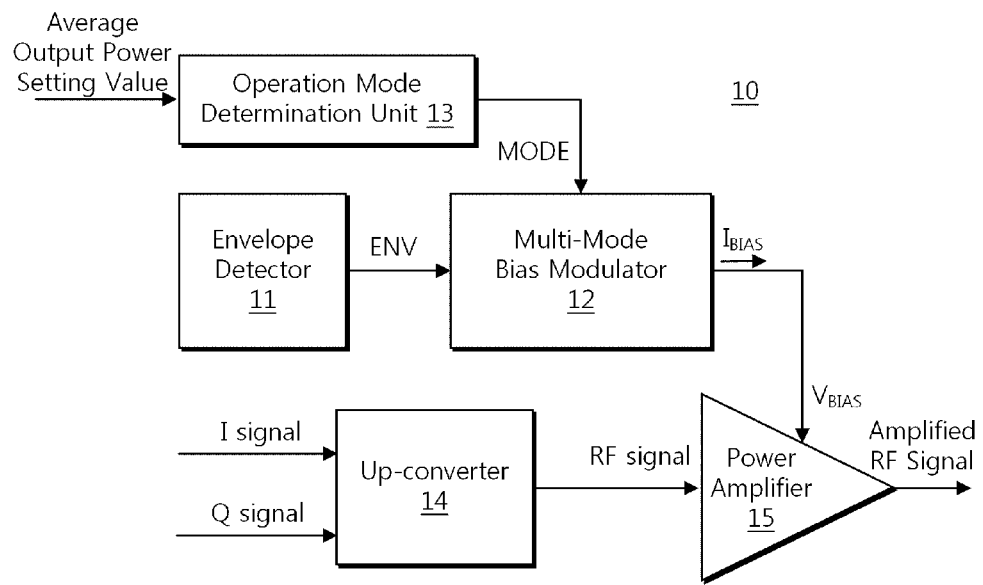
FIG. 1 is a block diagram of an envelope tracking power amplifier according to an embodiment of the present invention.

With regard to embodiments of the present invention disclosed herein, specific structural and functional descriptions are given merely for the purpose of illustrating the embodiments of the present invention. Embodiments of the present invention may be practiced in various forms, and the present invention should not be construed as being limited to embodiments disclosed herein.

Embodiments of the present invention will be described in detail below with reference to the accompanying drawings. The same reference numerals will be used to denote the same components throughout the accompanying drawings, and redundant descriptions of the same components will be omitted.

FIG. 1 is a block diagram of an envelope tracking power amplifier according to an embodiment of the present invention.

Referring to FIG. 1, the envelope tracking power amplifier 10 may include an envelope detector 11, a multi-mode bias modulator 12, an operation mode determination unit 13, an up-converter 14, and a power amplifier 15.

The envelope detector 11 may detect an envelope signal ENV from a baseband signal, or from an up-converted RF signal in some embodiments. When the envelope detector 11 is implemented in an analog fashion, it may simply include a rectifier diode and a low-pass filter that are connected in series. A baseband signal or an RF signal may be applied to the rectifier diode, and an envelope signal ENV may be output at both terminals of the low-pass filter. When the envelope detector 11 is implemented in a digital fashion, it may generate an envelope signal ENV by interpolating the peak values of baseband signal samples.

The multi-mode bias modulator 12 operates in any one of envelope tracking mode and average power tracking mode in response to an operation mode control signal MODE, and outputs a variable bias voltage $V_{BIAS}$.

Specifically, when the multi-mode bias modulator 12 operates in envelope tracking mode, the multi-mode bias modulator 12 drives a linear amplification bias current corresponding to the AC component of the envelope signal ENV via the linear amplifier, drives a switching amplification bias current corresponding to the DC component of the envelope signal ENV via the switching amplifier, combines the linear amplification bias current and the switching amplification bias current, and generates a variable bias current $I_{BIAS}$ for the power amplifier 15. In contrast, when the multi-mode bias modulator 12 operates in average power tracking mode, the multi-mode bias modulator 12 drives a switching amplification bias current, following a predetermined reference voltage, via only the switching amplifier, and generates a variable bias current $I_{BIAS}$ for the power amplifier 15. In this case, most of the variable bias current $I_{BIAS}$ substantially corresponds to the switching amplification bias current.

More specifically, when the operation mode based on the operation mode control signal MODE is envelope tracking mode, the linear amplifier of the multi-mode bias modulator 12 drives the linear amplification bias current via the operation amplifier that linearly amplifies the AC component of the envelope signal ENV, and the switching amplifier of the multi-mode bias modulator 12 drives the switching amplification bias current via a switching amplification stage that is switched according to a duty ratio determined based on the magnitude of the DC component of the envelope signal ENV. Accordingly, the multi-mode bias modulator 12 generates a variable bias current $I_{BIAS}$ in which the linear amplification bias current and the switching amplification bias current have been combined with each other.

In contrast, when the operation mode based on the operation mode control signal MODE is average power tracking mode, the linear amplifier of the multi-mode bias modulator 12 is inactivated, and the switching amplifier drives the switching amplification bias current via a switching amplification stage that is switched according to a duty ratio determined based on the difference between the variable bias voltage $V_{BIAS}$ output by the multi-mode bias modulator 12 and a predetermined reference voltage. Accordingly, the multi-mode bias modulator 12 generates a variable bias current $I_{BIAS}$.

The variable bias voltage $V_{BIAS}$ for the power amplifier 15 is represented by the output resistance of the multi-mode bias modulator 12 and the input resistance and variable bias current $I_{BIAS}$ of the power amplifier 15.

The operation mode determination unit 13 determines any one of operation modes, including at least envelope tracking mode and average power tracking mode, depending on the magnitude of average output power value that is set by the envelope tracking power amplifier 10, and outputs an operation mode control signal MODE.

For example, the operation mode determination unit 13 may output the operation mode control signal MODE so that the multi-mode bias modulator 12 operates in envelope tracking mode if the magnitude of externally set average output power is 20 dBm or higher and the multi-mode bias modulator 12 operates in average power tracking mode if the magnitude of externally set average output power is lower than 20 dBm.

In general, in the case of bias modulators, when they output the same level bias voltage, the power efficiency in envelope tracking mode is poorer than the power efficiency in the average power tracking mode. In particular, at high output, the power efficiency of the bias modulators in envelope tracking mode is slightly poorer than that of the bias modulators in average power tracking mode, whereas at low output, the power efficiency of the bias modulators in envelope tracking mode is significantly poorer than that of the bias modulators in average power tracking mode.

In contrast, in the case of power amplifiers, when they operate at the same level bias voltage, the power efficiency in envelope tracking mode is better than the power efficiency in average power tracking mode. However, at both high output and low output, the power efficiency of the power amplifiers in envelope tracking mode is slightly better than that of the power amplifiers in average power tracking mode.

As a result, when a high-output wireless signal is transmitted, the overall power efficiency of a power amplifier having a bias modulator and a power amplifier is better in envelope tracking mode than in average power tracking mode.

In contrast, when a low-output wireless signal is transmitted, the overall power efficiency of a power amplifier having a bias modulator and a power amplifier is somewhat better in average power tracking mode than in envelope tracking mode.

Accordingly, the power amplifier 10 including the multi-mode bias modulator 12 can exhibit excellent power efficiency regardless of whether the variable bias voltage $V_{BIAS}$ is high or low.

The up-modulator 14 generates an RF signal by up-modulating the I and Q components of a baseband signal using a specific appropriate modulation method.

The power amplifier 15 may receive the RF signal up-modulated by the up-modulator 14, may amplify the up-modulated RF signal based on the variable bias voltage $V_{BIAS}$ supplied by the multi-mode bias modulator 12, and may output the amplified RF signal to an antenna (not illustrated).

Figure 2:
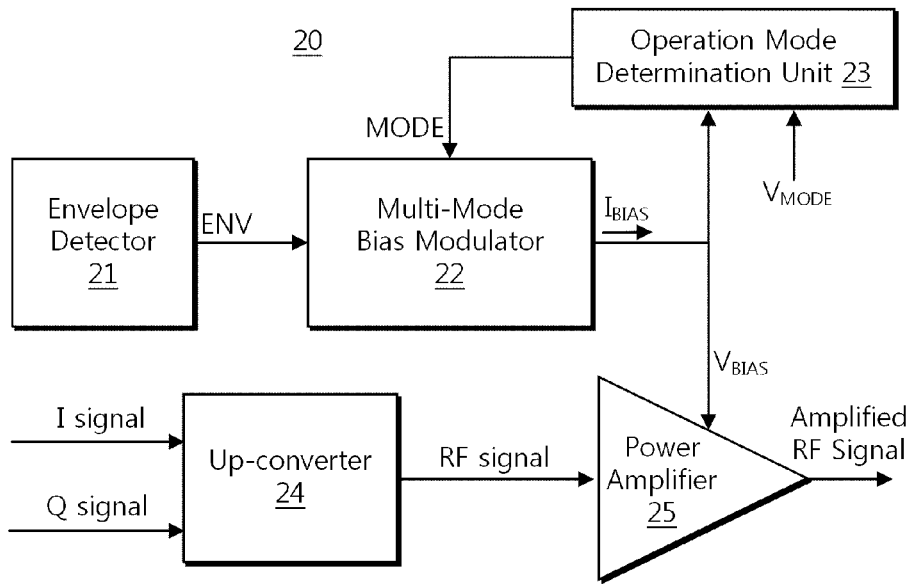
FIG. 2 is a block diagram of an envelope tracking power amplifier according to another embodiment of the present invention.

FIG. 2 is a block diagram of an envelope tracking power amplifier according to another embodiment of the present invention.

Referring to FIG. 2, the envelope tracking power amplifier 20 may include an envelope detector 21, a multi-mode bias modulator 22, an operation mode determination unit 23, an up-converter 24, and a power amplifier 25.

Since the envelope detector 21, multi-mode bias modulator 22, up-converter 24, and power amplifier 25 of the envelope tracking power amplifier 20 of FIG. 2 are substantially the same as or similar to the envelope detector 11, multi-mode bias modulator 12, up-converter 14, and power amplifier 15 of the envelope tracking power amplifier 10 of FIG. 1, descriptions thereof are omitted for the sake of convenience.

The operation mode determination unit 23 detects the level of the variable bias voltage $V_{BIAS}$ output by the multi-mode bias modulator 22, determines any one of operation modes, including at least envelope tracking mode and average power tracking mode based on the results of the comparison between the detected level of the detected variable bias voltage $V_{BIAS}$ and the level of a specific mode determination reference voltage $V_{MODE}$, and outputs the operation mode control signal MODE. In this case, although the operation mode determination unit 23 may compare the instantaneous level of the variable bias voltage $V_{BIAS}$ with the predetermined mode determination reference voltage $V_{MODE}$ it may compare the average level of the variable bias voltage $V_{BIAS}$ for a predetermined period.

In some embodiments, the operation mode determination unit 23 may detect the level of the variable bias voltage $V_{BIAS}$ output by the multi-mode bias modulator 22, may determine any one of operation modes, including at least envelope tracking mode and average power tracking mode, based on the results of the comparison between the detected level of the variable bias voltage $V_{BIAS}$ and a specific mode determination reference hysteresis range, and may output the operation mode control signal MODE. In the same manner, although the operation mode determination unit 23 may compare the instantaneous level of the variable bias voltage $V_{BIAS}$ with the predetermined mode determination reference hysteresis range, it may compare the average level of the variable bias voltage $V_{BIAS}$ for a predetermined period.

Figure 3:
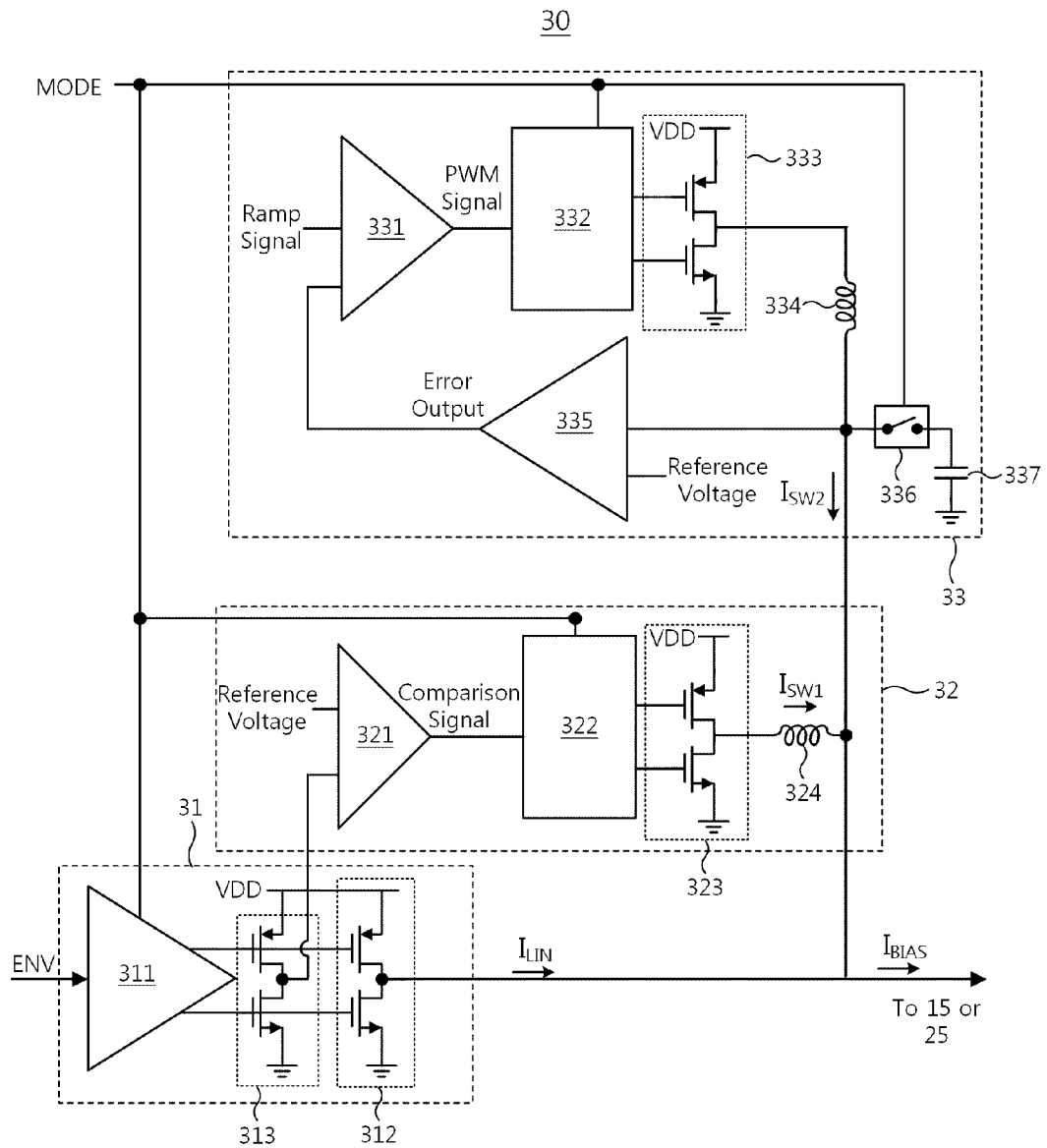
FIG. 3 is a circuit diagram of a multi-mode bias modulator used in the envelope tracking power amplifiers according to an embodiment of the present invention.

FIG. 3 is a circuit diagram of a multi-mode bias modulator used in the envelope tracking power amplifiers according to an embodiment of the present invention.

The power of the envelope signal ENV is chiefly present in a DC component or a low frequency band, and the remaining power is present in an AC component or a high frequency band. For this reason, in general, in the envelope tracking power amplifier, the switching amplifier operating in a low frequency band with high efficiency may be configured to amplify the DC component of the envelope signal ENV, and the linear amplifier having a wide operating frequency band may be configured to amplify the AC component of the envelope signal ENV.

However, as described above, at low bias voltage and low output power, a power amplifier in envelope tracking mode generally has low efficiency. Accordingly, the multi-mode bias modulator 30 of the present invention operates in average power tracking mode instead of envelope tracking mode in a situation in which low output power is required.

Accordingly, the multi-mode bias modulator 30 according to the present embodiment may operate in any one of envelope tracking mode and average power tracking mode in accordance with an operation mode control signal MODE, and may include a linear amplifier 31 configured to drive a linear amplification bias current $I_{LIN}$ in accordance with the AC component of an envelope signal ENV in envelope tracking mode, and to be inactivated in average power tracking mode; a first switching amplifier 32 configured to drive a first switching amplification bias current $I_{sw1}$ in accordance with a duty ratio determined based on the magnitude of the DC component of the envelope signal ENV in envelope tracking mode, and to be inactivated in average power tracking mode; and a second switching amplifier 33 configured to be inactivated in envelope tracking mode, and to drive a second switching amplification bias current $I_{sw2}$ in accordance with a duty ratio corresponding to an error between an output variable bias voltage $V_{BIAS}$ and a predetermined reference voltage in average power tracking mode.

Accordingly, the multi-mode bias modulator 30, during operation in envelope tracking mode, drives a variable bias current $I_{BIAS}$ by combining the linear amplification bias current $I_{LIN}$ output by the linear amplifier 31 with the first switching amplification bias current $I_{sw1}$ output by the first switching amplifier 32 and, during operation in average power tracking mode, generates a variable bias current $I_{BIAS}$ as the second switching amplification bias current $I_{sw2}$ that is driven by the second switching amplifier 33.

For this purpose, the linear amplifier 31 includes, for example, a linear amplifier 311, a class AB buffer 312 and a detection unit 313, and may be electrically connected such that, in accordance with an operation mode control signal MODE, during operation in envelope tracking mode, the operations of both the linear amplifier 311 and the class AB buffer 312 are activated and, during operation in average power tracking mode, at least any one of the linear amplifier 311 and the class AB buffer 312, particularly the operation of the linear amplifier 311, is inactivated.

More specifically, first, the envelope signal ENV is applied to the operation amplifier 311 of the linear amplifier 31. In general, the operation amplifier 311 may operate using high input resistance, low output resistance, a very high open-loop gain value and a wide bandwidth, and may guarantee linearity in the AC component of the envelope signal.

Furthermore, the operation amplifier 311 may be designed in a rail-to-rail manner, and thus may maximize the voltage range of the differential output signal of the operation amplifier 311 within a power source voltage range.

The operation amplifier 311 is set, for example, such that it has a specific gain value determined by input-side resistance and feedback resistance, amplifies the input envelope signal ENV based on the specific gain value, and outputs a differential output signal pair in a complementary form.

Meanwhile, the operation amplifier 311 may be configured to be connected to a supply voltage only when the operation mode control signal MODE corresponds to envelope tracking mode.

The differential output signal pair output by the operation amplifier 311 is input to the control terminals of the push and pull devices of the class AB buffer 312. In this case, the push device may be a p-channel metal oxide semiconductor (PMOS) device, and the pull device may be an n-channel MOS (NMOS) device.

The first and second class AB buffer 312 may include a PMOS push device and an NMOS pull device connected in series between a power source voltage (VDD) line and a ground line so that a rail-to-rail operation can be performed, and may drive the linear amplification bias current $I_{LIN}$ at a connection terminal for the PMOS push device and the NMOS pull device.

The class AB buffer 312 may be configured to be connected to a supply voltage only when the operation mode control signal MODE corresponds to envelope tracking mode.

For the switching amplification of the DC component of the envelope signal ENV, the output voltage of the class AB buffer based on the differential output signal pair of the operation amplifier 311 of the linear amplifier 31 is detected by the detection unit 313, and is transferred to the first switching amplifier 32 as a switching input signal. Like the first and second class AB buffer 312, the detection unit 313 may have a rail-to-rail class AB buffer structure, that is, a PMOS push device and an NMOS pull device connected in series between the power source voltage (VDD) line and the ground line, and may output the voltage of a connection terminal for the PMOS push device and the NMOS pull device as the switching input signal.

Furthermore, the first switching amplifier 32 may include, for example, an open loop including a first comparator 321, a first shooting current prevention and driving circuit unit 322, a first switching amplification stage 323, and an inductor 324.

Furthermore, the first switching amplifier 32 may be electrically connected such that in accordance with the operation mode control signal MODE, during operation in envelope tracking mode, all the operations of the first comparator 321, the first shooting current prevention and driving circuit unit 322 and the first switching amplification stage 323 are activated and, during operation in average power tracking mode, the operation of at least any one of the first comparator 321, the first shooting current prevention and driving circuit unit 322 and the first switching amplification stage 323, particularly the first shooting current prevention and driving circuit unit 322, is inactivated.

The first comparator 321 compares the switching input signal, output by the detection unit 313 connected to the linear amplifier 31, with a specific reference voltage, and outputs a comparison signal that is activated when the voltage level of the switching input signal is higher than the specific reference voltage. If the DC component of the envelope signal ENV increases, the time it takes for the switching input signal to become higher than the reference voltage increases, and thus the duty ratio of the comparison signal also increases. The first switching amplification stages 323 is driven in response to the duty ratio of the comparison signal, and thus the first switching amplification bias current $I_{SW}$ is output.

The first shooting current prevention and driving circuit unit 322 may generate a driving voltage pair that will drive the pull-up and pull-down devices of the first switching amplification stage 323 in response to the comparison signal of the first comparator 321. In this case, the first shooting current prevention and driving circuit unit 322 may generate the driving voltage pair for the first switching amplification stage 323 in order to prevent the phenomenon in which the pull-up and pull-down devices of the first switching amplification stage 323 that are connected in series are simultaneously turned on and, thus, an electric current is directly shot from the power source voltage (VDD) to the ground line.

The driving voltage pair output by the first shooting current prevention and driving circuit unit 322 is input to the control terminals of the pull-up and pull-down devices of the first switching amplification stage 323. In this case, the pull-up device may be a PMOS device, and the pull-down device may be an NMOS device.

The first switching amplification stage 323 may include a PMOS pull-up device and an NMOS pull-down device connected in series between the power source voltage (VDD) line and the ground line so that the rail-to-rail operation can be performed, and may drive the first switching amplification bias current $I_{SW1}$ at a connection terminal for the PMOS pull-up device and the NMOS pull-down device.

The first inductor 324 operates as a type of low-pass filter that smoothes the first switching amplification bias current $I_{sw1}$ responsible for the DC component of the envelope modulated bias current $I_{BIAS}$.

The second switching amplifier 33 may include, for example, a closed loop, including a second comparator 331, a second shooting current prevention and driving circuit unit 332, a second switching amplification stage 333, a second inductor 334 and an error amplifier 335, and a switch 336 and a capacitor 337 connected in series between a contact between the second inductor 334 and the error amplifier 335 and a ground.

Furthermore, the second switching amplifier 33 may be electrically connected such that in accordance with the operation mode control signal MODE, during operation in envelope tracking mode, the operation of at least any one of the second comparator 331, the second shooting current prevention and driving circuit unit 332, the second switching amplification stage 333 and the error amplifier 335, particularly the second shooting current prevention and driving circuit unit 332, is inactivated and the capacitor 337 is separated from the second inductor 334 by the open switch 336 and, during operation in average power tracking mode, all the operations of the second comparator 331, the second shooting current prevention and driving circuit unit 332, the second switching amplification stage 333 and the error amplifier 335 are activated and the capacitor 337 is connected to a contact between the second inductor 334 and the error amplifier 335 by the closed switch 336.

The second comparator 321 compares the error output of the error amplifier 335 with a ramp signal in a predetermined period, and outputs a pulse width modulation (PWM) signal.

The second shooting current prevention and driving circuit unit 332 generates a driving voltage pair that will drive the pull-up and pull-down devices of the second switching amplification stage 333 in accordance with the PWM signal of the second comparator 331. In this case, the second shooting current prevention and driving circuit unit 332 may generate the driving voltage pair for the second switching amplification stage 333 in order to prevent the phenomenon in which the pull-up and pull-down devices of the second switching amplification stage 333 that are connected in series are simultaneously turned on and, thus, an electric current is directly shot from the power source voltage (VDD) to the ground line.

The driving voltage pair output by the second shooting current prevention and driving circuit unit 332 is input to the control terminals of the pull-up and pull-down devices of the second switching amplification stage 333. In this case, the pull-up device may be a PMOS device, and the pull-down device may be an NMOS device.

The second switching amplification stage 333 may include a PMOS pull-up device and an NMOS pull-down device connected in series between the power source voltage (VDD) line and the ground line so that the rail-to-rail operation can be performed, and may drive the second switching amplification bias current $I_{sw2}$ at a connection terminal for the PMOS pull-up device and the NMOS pull-down device.

The second inductor 334 operates as a type of low-pass filter that smoothes the second switching amplification bias current $I_{sw2}$ along with the capacitor 337 that is connected by the switch 336.

The error amplifier 335 amplifies an error between a variable bias voltage $V_{BIAS}$, related to the second switching amplification bias current $I_{sw2}$, the output resistance of the multi-mode bias modulator 30 and the input resistance of the power amplifiers 15 and 25 in a back stage, and a predetermined reference voltage with a predetermined gain, and the outputs the amplified error to the second comparator 331.

The closed loop of the second switching amplifier 33 may generate a variable bias voltage $V_{BIAS}$ that follows the reference voltage in such a way as to reduce an error with the reference voltage as the variable bias voltage $V_{BIAS}$ increases because when an error between the variable bias voltage $V_{BIAS}$ output by the second switching amplifier 33 and the reference voltage is large, the duty ratio of the PWM signal output by the second comparator 331 is high, so that the second switching amplification bias current $I_{sw2}$ output by the second switching amplification stage 333 increases.

Meanwhile, the reference voltage input to the first comparator 331 of the first switching amplifier 32 and the reference voltage input to the error amplifier 335 of the second switching amplifier 33 may be the same or be different from each other depending on the embodiment.

Accordingly, the multi-mode bias modulator 30 can exhibit excellent power efficiency regardless of whether the output variable bias voltage $V_{BIAS}$ is high or low, in other words, whether the average output power is high or low.

Figure 4:
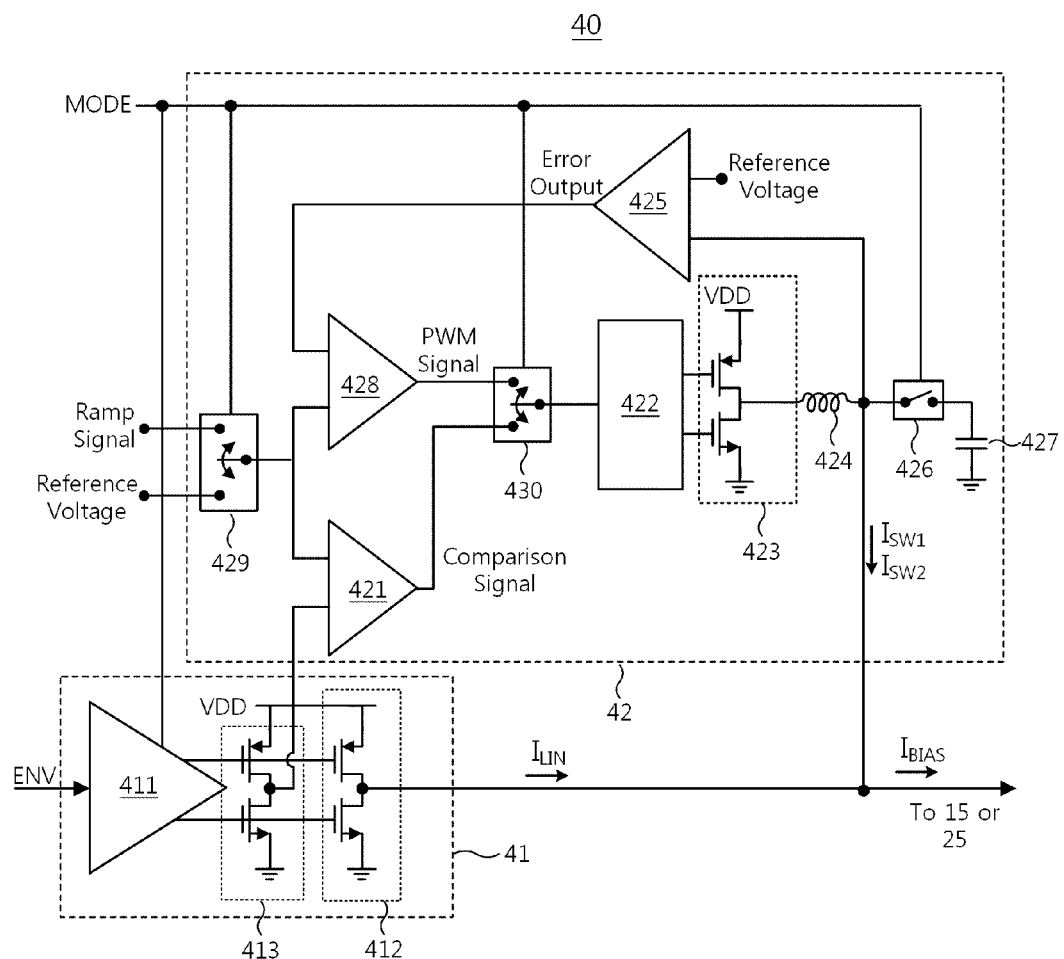
FIG. 4 is a circuit diagram of a multi-mode bias modulator used in the envelope tracking power amplifiers according to another embodiment of the present invention.

FIG. 4 is a circuit diagram of a multi-mode bias modulator used in the envelope tracking power amplifiers according to another embodiment of the present invention.

The multi-mode bias modulator 40 of FIG. 4 is configured to allow some components to be shared, unlike the multi-mode bias modulator 30 of FIG. 3 in which the first switching amplifier 32 and the second switching amplifier 33 are configured as independent circuits.

The multi-mode bias modulator 40 according to the present embodiment may operate in any one of envelope tracking mode and average power tracking mode in accordance with an operation mode control signal MODE, and may include a linear amplifier 41 configured to drive a linear amplification bias current $I_{LIN}$ in accordance with the AC component of an envelope signal ENV in envelope tracking mode, and to be inactivated in average power tracking mode; and a switching amplifier 42 configured to drive a first switching amplification bias current $I_{sw1}$ corresponding to the DC component of an envelope signal ENV in envelope tracking mode, and to drive a second switching amplification bias current $I_{sw2}$ in accordance with a duty ratio corresponding to the magnitude of an error between an output variable bias voltage $V_{BIAS}$ and a predetermined reference voltage in average power tracking mode.

Accordingly, the multi-mode bias modulator 50, during operation in envelope tracking mode, generates a variable bias current $I_{BIAS}$ by combining the linear amplification bias current $I_{LIN}$ driven by the linear amplifier 41 with the first switching amplification bias current $I_{sw1}$ driven by the switching amplifier 42 and, during operation in average power tracking mode, generates a variable bias current $I_{BIAS}$ as the second switching amplification bias current $I_{sw2}$ driven by the switching amplifier 42.

Since the operation amplifier 411, the class AB buffer 412 and the detection unit 413 constituting the linear amplifier 41 of the multi-mode bias modulator 40 of FIG. 4 are substantially the same as the operation amplifier 311, the class AB buffer 312 and the detection unit 313 constituting the linear amplifier 31 of the multi-mode bias modulator 30 of FIG. 3, related descriptions are omitted.

The switching amplifier 42 may include, for example, a first comparator 421, a shooting current prevention and driving circuit unit 422, a switching amplification stage 423, an inductor 424, an error amplifier 425, a switch 426, a capacitor 427, a second comparator 428, a first multiplexer 429, and a second multiplexer 430.

The switching amplifier 42 is configured such that in accordance with an operation mode control signal MODE, during operation in envelope tracking mode, an open loop, including the first comparator 421, the shooting current prevention and driving circuit unit 422, the switching amplification stage 423 and the inductor 424, is activated and also the capacitor 427 is separated from the inductor 424 by the open switch 426, thereby outputting the first switching amplification bias current $I_{sw1}$ and, during operation in average power tracking mode, a closed loop, including the error amplifier 425, the second comparator 428, the shooting current prevention and driving circuit unit 422, the switching amplification stage 423 and the inductor 424, is activated and also the capacitor 427 is connected to a contact between the inductor 424 and the error amplifier 425 by the closed switch 426, thereby driving the second switching amplification bias current $I_{sw2}$.

Accordingly, the switching amplifier 42 is operated such that in accordance with an operation mode control signal MODE, during operation in envelope tracking mode, a comparison signal of the first comparator 421 that compares a switching input signal of the linear amplifier 41 with a reference voltage is applied to the shooting current prevention and driving circuit unit 422 and the switching amplification stage 423 and, during operation in average power tracking mode, a PWM signal of the second comparator 428 that compares an error between an output variable bias voltage $V_{BIAS}$ and a reference voltage with a ramp signal is applied to the shooting current prevention and driving circuit unit 422 and the switching amplification stage 423.

For this purpose, more specifically, the switching amplifier 42 includes the first multiplexer 429 and the second multiplexer 430 that operate in accordance with the operation mode control signal MODE.

The first multiplexer 429 is operated to, during operation in envelope tracking mode, select the reference voltage from among the ramp signal and the reference voltage and then apply the reference voltage to the first comparator 421 and, during operation in average power tracking mode, select the ramp signal from among the ramp signal and the reference voltage and then apply the ramp signal to the second comparator 428.

The second multiplexer 430 is operated to, during operation in envelope tracking mode, apply the comparison signal, output by the first comparator 421, to the shooting current prevention and driving circuit unit 422 and, during operation in average power tracking mode, apply the PWM signal, output by the second comparator 428, to the shooting current prevention and driving circuit unit 422.

Accordingly, during operation in envelope tracking mode, the first comparator 421 compares the switching input voltage from the detection unit 413 of the linear amplifier 41 with a reference voltage via the first multiplexer 429 and then outputs a comparison signal, and the output comparison signal is applied to the shooting current prevention and driving circuit unit 422 and the switching amplification stage 423. Therefore, the switching amplification stage 423 is driven in accordance with the duty ratio of the comparison signal varying depending on the magnitude of the DC component of an envelope signal ENV, and the first switching amplification bias current $I_{sw1}$ varying depending on the magnitude of the DC component of an envelope signal ENV is driven from the switching amplification stage 423.

Meanwhile, in some embodiments, during operation in envelope tracking mode, the operation of at least any one of the second comparator 428 and the error amplifier 425 may be inactivated.

Furthermore, during operation in average power tracking mode, the second comparator 428 receives the error between the output variable bias voltage $V_{BIAS}$ and the reference voltage from the error amplifier 425, compares the error output with the ramp signal, and outputs a PWM signal, and the output PWM signal is applied to the shooting current prevention and driving circuit unit 422 and the switching amplification stage 423. Accordingly, the switching amplification stage 423 is driven in accordance with the duty ratio of the PWM signal varying depending on the magnitude of the error output, and the second switching amplification bias current $I_{sw2}$ varying depending on the magnitude of the error output is driven from the switching amplification stage 423.

Meanwhile, in some embodiments, during operation in average power tracking mode, the operation of the first comparator 421 may be inactivated, along with the operation of the linear amplifier 41.

The configuration and operation of the switching amplifier 42 in which during operation in envelope tracking mode in accordance with an operation mode control signal MODE, an open loop is activated as the first comparator 421, the shooting current prevention and driving circuit unit 422, the switching amplification stage 423 and the inductor 424 and also the capacitor 427 is separated from the inductor 424 by the open switch 426 are substantially the same as those of the first switching amplifier 32 of FIG. 3.

Furthermore, the configuration and operation of the switching amplifier 42 in which during operation in average power tracking mode in accordance with an operation mode control signal MODE, a closed loop is activated as the error amplifier 425, the second comparator 428, the shooting current prevention and driving circuit unit 422, the switching amplification stage 423 and the inductor 424 and also the capacitor 427 is connected to a contact between the inductor 424 and the error amplifier 335 by the closed switch 426 are substantially the same as those of the second switching amplifier 33 of FIG. 3.

Accordingly, a description of the detailed operation of the switching amplifier 42 in each of the two operation modes is omitted.

Figure 5:
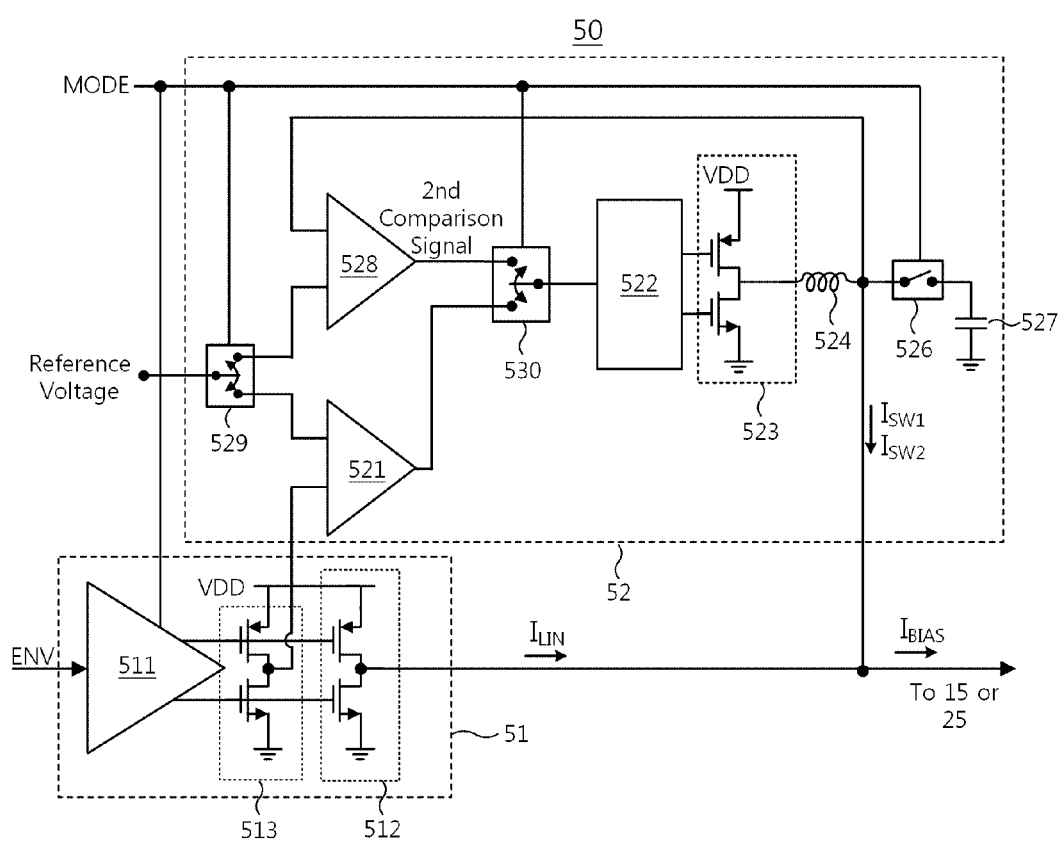
FIG. 5 is a circuit diagram of a multi-mode bias modulator used in the envelope tracking power amplifiers according to still another embodiment of the present invention.

FIG. 5 is a circuit diagram of a multi-mode bias modulator used in the envelope tracking power amplifiers according to still another embodiment of the present invention.

The multi-mode bias modulator 50 of FIG. 5 is configured to allow some components to be shared, like the multi-mode bias modulator 40 of FIG. 4 and unlike the multi-mode bias modulator 30 of FIG. 3 in which the first switching amplifier 32 and the second switching amplifier 33 are configured as independent circuits.

The multi-mode bias modulator 50 according to the present embodiment may operate in any one of envelope tracking mode and average power tracking mode in accordance with an operation mode control signal MODE, and may include a linear amplifier 51 configured to drive a linear amplification bias current $I_{LIN}$ in accordance with the AC component of an envelope signal ENV during operation in envelope tracking mode, and to be inactivated in average power tracking mode; and a switching amplifier 52 configured to drive a first switching amplification bias current $I_{sw1}$ corresponding to the DC component of an envelope signal ENV in envelope tracking mode, and to generate a second switching amplification bias current $I_{sw2}$ in accordance with a duty ratio corresponding to the magnitude of an error between an output variable bias voltage $V_{BIAS}$ and a predetermined reference voltage in average power tracking mode.

Accordingly, the multi-mode bias modulator 50, during operation in envelope tracking mode, generates a variable bias current $I_{BIAS}$ by combining the linear amplification bias current $I_{LIN}$ output by the linear amplifier 51 with the first switching amplification bias current $I_{sw1}$ output by the switching amplifier 52 and, during operation in average power tracking mode, generates a variable bias current $I_{BIAS}$ as the second switching amplification bias current $I_{sw2}$ driven by the switching amplifier 52.

Since the operation amplifier 511, the class AB buffer 512 and the detection unit 513 constituting the linear amplifier 51 of the multi-mode bias modulator 50 of FIG. 5 are substantially the same as the operation amplifier 311, the class AB buffer 312 and the detection unit 313 constituting the linear amplifier 31 of the multi-mode bias modulator 30 of FIG. 3, like the linear amplifier 41 of the multi-mode bias modulator 40 of FIG. 4, related descriptions are omitted.

The switching amplifier 52 may include, for example, a first comparator 521, a shooting current prevention and driving circuit unit 522, a switching amplification stage 523, an inductor 524, a switch 526, a capacitor 527, a second comparator 528, a multiplexer 529, and a multiplexer 530. Unlike the switching amplifier 42 of the multi-mode bias modulator 40, the switching amplifier 52 of the multi-mode bias modulator 50 does not include an error amplifier, and the variable bias voltage $V_{BIAS}$ is input to the second comparator 528.

The switching amplifier 52 is configured such that in accordance with an operation mode control signal MODE, during operation in envelope tracking mode, an open loop, including the first comparator 521, the shooting current prevention and driving circuit unit 522, the switching amplification stage 523 and the inductor 524, is activated and also the capacitor 527 is separated from the inductor 524 by the open switch 526, thereby outputting the first switching amplification bias current $I_{sw1}$ and, during operation in average power tracking mode, a closed loop, including the error amplifier 525, the second comparator 528, the shooting current prevention and driving circuit unit 522, the switching amplification stage 523 and the inductor 524, is activated and also the capacitor 527 is connected to a contact between the inductor 524 and the error amplifier 525 by the closed switch 526, thereby driving the second switching amplification bias current $I_{sw2}$.

Accordingly, the switching amplifier 52 is operated such that in accordance with an operation mode control signal MODE, during operation in envelope tracking mode, a first comparison signal of the first comparator 521 that compares a switching input signal of the linear amplifier 51 with a reference voltage is applied to the shooting current prevention and driving circuit unit 522 and the switching amplification stage 523 and, during operation in average power tracking mode, a second comparison signal of the second comparator 528 that compares an error between an output variable bias voltage $V_{BIAS}$ and a reference voltage with a ramp signal is applied to the shooting current prevention and driving circuit unit 522 and the switching amplification stage 523.

For this purpose, more specifically, the switching amplifier 52 includes a demultiplexer 529 and a multiplexer 530 that operate in accordance with the operation mode control signal MODE.

The demultiplexer 529 is operated to, during operation in envelope tracking mode, apply the reference voltage to the first comparator 521 and, during operation in average power tracking mode, apply the reference voltage to the second comparator 528.

The multiplexer 530 is operated to, during operation in envelope tracking mode, apply the first comparison signal, output by the first comparator 521, to the shooting current prevention and driving circuit unit 522 and, during operation in average power tracking mode, apply the second comparison signal, output by the second comparator 528, to the shooting current prevention and driving circuit unit 522.

Accordingly, during operation in envelope tracking mode, the first comparator 521 compares a switching input voltage from the detection unit 513 of the linear amplifier 51 with a reference voltage via the demultiplexer 529 and then outputs the first comparison signal, and the output first comparison signal is applied to the shooting current prevention and driving circuit unit 522 and the switching amplification stage 523. Therefore, the switching amplification stage 523 is driven in accordance with the duty ratio of the comparison signal varying depending on the magnitude of the DC component of an envelope signal ENV, and the first switching amplification bias current $I_{sw1}$ varying depending on the magnitude of the DC component of an envelope signal ENV is driven from the switching amplification stage 523.

Meanwhile, in some embodiments, during operation in envelope tracking mode, the operation of the second comparator 528 may be inactivated.

Furthermore, during operation in average power tracking mode, the second comparator 528 compares the output variable bias voltage $V_{BIAS}$ with the reference voltage and then outputs a second comparison signal, and the output second comparison signal is applied to the shooting current prevention and driving circuit unit 522 and the switching amplification stage 523. Accordingly, the switching amplification stage 523 is driven in accordance with the duty ratio of the second comparison signal varying depending on an error between the output variable bias voltage $V_{BIAS}$ and the reference voltage, and the second switching amplification bias current $I_{sw2}$ varying depending on the magnitude of the error output is output from the switching amplification stage 523.

Meanwhile, in some embodiments, during operation in average power tracking mode, the operation of the first comparator 521 may be inactivated, along with the operation of the linear amplifier 51.

The configuration and operation of the switching amplifier 52 in which in accordance with an operation mode control signal MODE, during operation in envelope tracking mode, an open loop is activated as the first comparator 521, the shooting current prevention and driving circuit unit 522, the switching amplification stage 523 and the inductor 524 and also the capacitor 527 is separated from the inductor 524 by the open switch 526 are substantially the same as those of the first switching amplifier 32 of FIG. 3.

Furthermore, the configuration and operation of the switching amplifier 52 in which in accordance with an operation mode control signal MODE, during operation in average power tracking mode, a closed loop is activated as the second comparator 528, the shooting current prevention and driving circuit unit 522, the switching amplification stage 523 and the inductor 524 and also the capacitor 527 is connected to a contact between the inductor 524 and the second comparator 528 by the closed switch 526 are substantially the same as those of the second switching amplifier 33 of FIG. 3.

Accordingly, a description of the detailed operation of the switching amplifier 52 in each of the two operation modes is omitted.

Due to the presence of an error amplifier and a ramp signal, power amplification performance and power efficiency attributable to the variable bias voltage $V_{BIAS}$ that is output by the multi-mode bias modulator 50 of FIG. 5 is somewhat lower than power amplification performance and power efficiency achieved by the multi-mode bias modulator 40 of FIG. 4, but advantages arise in that a circuit area that are occupied by the error amplifier and a circuit for generating the ramp signal can be removed and also power consumption can be reduced.

Figure 6:
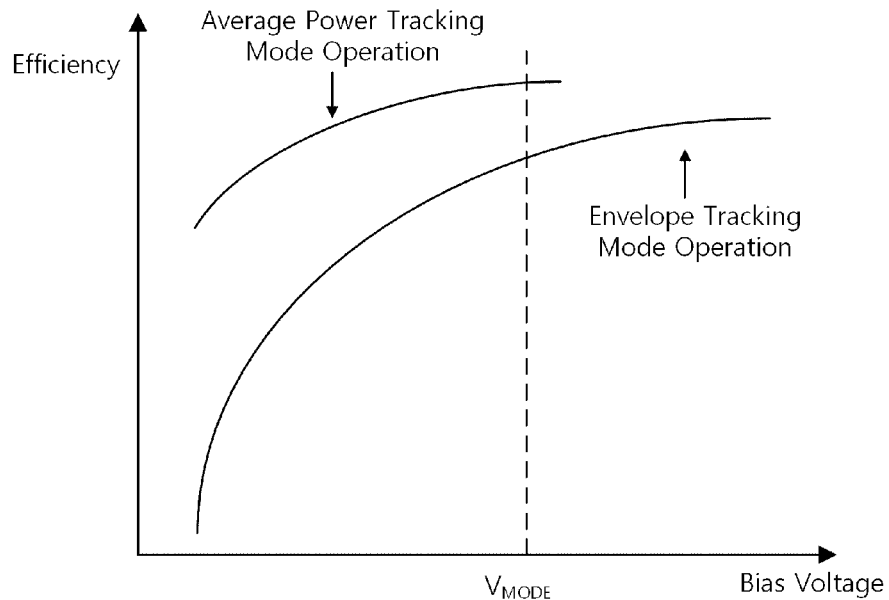
FIG. 6 is a conceptual diagram comparing power efficiency based on envelope tracking mode with power efficiency based on average power tracking mode in the multi-mode bias modulators used in the envelope tracking power amplifiers according to the embodiments of the present invention.

FIG. 6 is a conceptual diagram comparing power efficiency based on envelope tracking mode with power efficiency based on average power tracking mode in the multi-mode bias modulators used in the envelope tracking power amplifiers according to the embodiments of the present invention.

Referring to FIG. 6, the power efficiency of the bias modulators in average power tracking mode are higher than the power efficiency of the bias modulators in envelope tracking mode throughout a variable bias voltage range. In particular, as the variable bias voltage of the bias modulators in average power tracking mode increases, the power efficiency of the bias modulators increases.

However, when a high-output wireless signal should be transmitted, the power efficiency of the power amplifiers supplied with a high variable bias voltage in average power tracking mode is lower than that in envelope tracking mode.

Accordingly, at high output, the overall power efficiency of the power amplifiers is better in envelope tracking mode than in average power tracking mode.

In contrast, when a low-output wireless signal should be transmitted, the power efficiency of the power amplifiers supplied with a low variable bias voltage in average power tracking mode is higher than that in envelope tracking mode.

Accordingly, at low output, the overall power efficiency of the power amplifiers is better in average power tracking mode than in envelope tracking mode.

In an embodiment, the multi-mode bias modulator may operate in average power tracking mode in a power range lower than a specific average power value, and may operate in envelope tracking mode in a power range higher than the specific average power value.

In another embodiment, when a variable bias voltage at which the efficiency of the envelope tracking power amplifier 10 in average power tracking mode is the same as that of the envelope tracking power amplifier 10 in envelope tracking mode is set as an operation mode determination reference voltage, the multi-mode bias modulator may operate in average power tracking mode in a variable bias voltage range lower than the operation mode determination reference voltage, and may operate in envelope tracking mode in a variable bias voltage range equal to or higher than the operation mode determination reference voltage.

Accordingly, high efficiency can be achieved throughout the overall range of the variable bias voltage if operation mode can be determined based on the operation mode determination reference voltage and also the operations of the linear amplifier and the switch amplifier can be set based on the determined operation mode, as illustrated in FIG. 2.

However, switching noise may occur due to the multiplexer, the demultiplexer or the switch when the operation mode is switched. In some embodiments, in order to prevent switching from occurring excessively frequently, the operation mode is not strictly determined based on the operation mode determination reference voltage, but may be flexibly determined based on a hysteresis range including the operation mode determination reference voltage.

Figure 7:
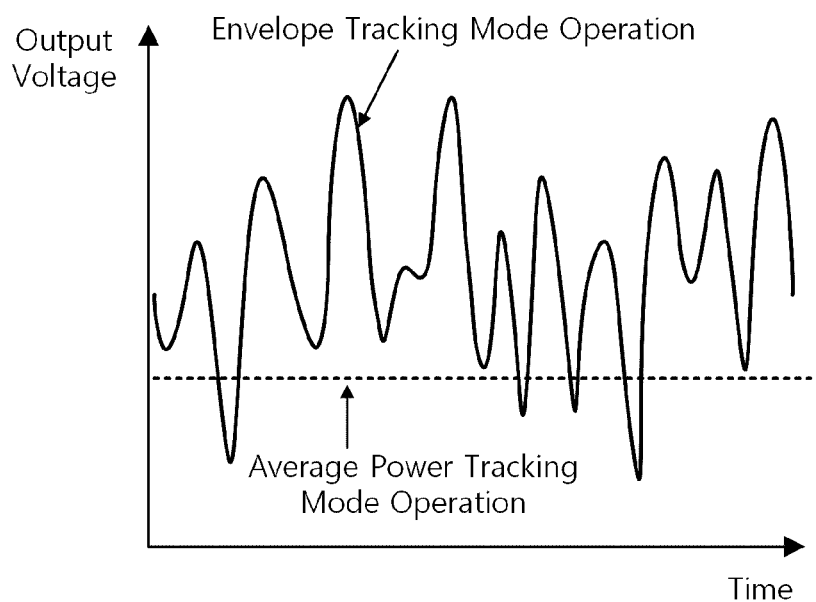
FIG. 7 is a conceptual diagram of an operation of changing mode depending on average output power with respect to an exemplary envelope waveform in the multi-mode bias modulator used in the envelope tracking power amplifier according to an embodiment of the present invention.

FIG. 7 is a conceptual diagram of an operation of changing mode based on average output power with respect to an exemplary envelope waveform in the multi-mode bias modulator used in the envelope tracking power amplifier according to an embodiment of the present invention.

Referring to FIG. 7, in the envelope tracking power amplifier 10 of FIG. 1, when a relatively high average output power setting value is set based on a specific average output power setting value, the multi-mode bias modulator 12 operates in envelope tracking mode because a relatively high variable bias voltage is required. In contrast, when a relatively low average output power setting value is set, the multi-mode bias modulator 12 operates in average power tracking mode because a relatively low variable bias voltage is required. Accordingly, excellent power efficiency can be maintained regardless of whether the envelope tracking power amplifier 10 operates with low average output power or high average output power.

Figure 8:
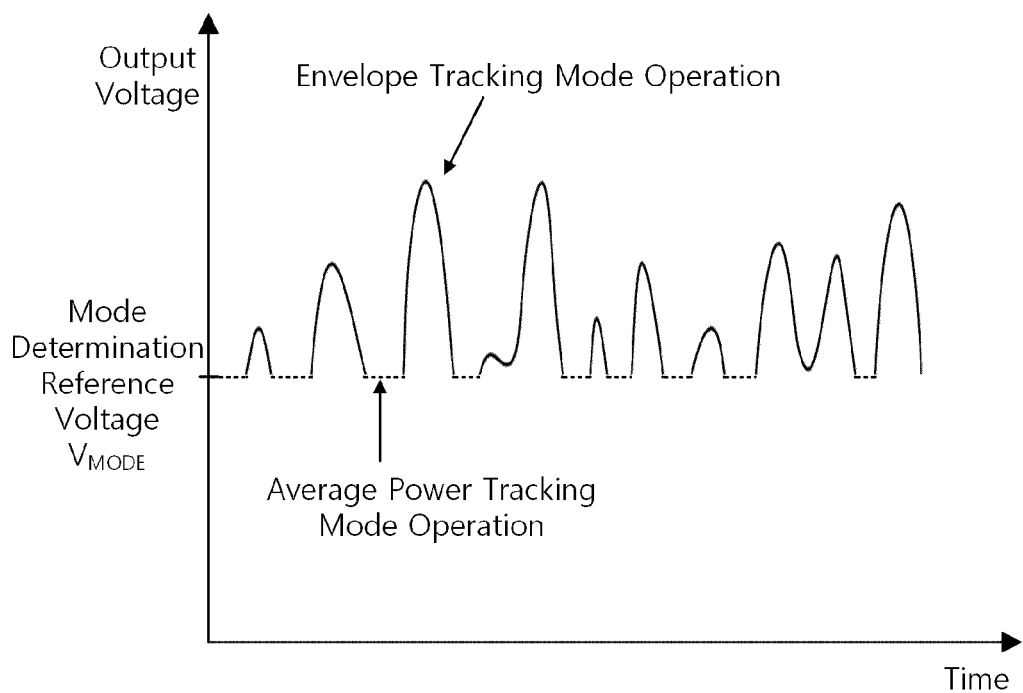
FIG. 8 is a conceptual diagram of an operation of frequently changing mode with respect to an exemplary envelope waveform in the multi-mode bias modulator used in the envelope tracking power amplifier according to another embodiment of the present invention.

FIG. 8 is a conceptual diagram of an operation of frequently changing mode with respect to an exemplary envelope waveform in the multi-mode bias modulator used in the envelope tracking power amplifier according to another embodiment of the present invention.

Referring to FIG. 8, the envelope tracking power amplifier 20 of FIG. 2, based on the operation mode determination reference voltage $V_{MODE}$ for example, a voltage level corresponding to a variable bias voltage at which the efficiency of the envelope tracking power amplifier 10 in average power tracking mode is the same as that in envelope tracking mode, operates the multi-mode bias modulator 22 in envelope tracking mode when a high variable bias voltage level is required, and operates the multi-mode bias modulator 22 in average power tracking mode when a lower variable bias voltage level is required, thereby maintaining desirable power efficiency at both low variable bias voltage and high variable bias voltage.

Although in FIG. 8, the variable bias voltage is illustrated as being maintained at a specific level during operation in average power tracking mode, the variable bias voltage level in average power tracking mode may be continuously changed according to the setting of output power.

In accordance with the multi-mode bias modulator operating in envelope tracking mode or average power tracking mode and the envelope tracking power amplifier using the same according to the embodiments of the present invention, efficiency can be improved in a wide power region.

In accordance with the multi-mode bias modulator operating in envelope tracking mode or average power tracking mode and the envelope tracking power amplifier using the same according to the embodiments of the present invention, the complexity of a circuit can be minimized and efficiency power can also be improved even at lower output.

The above embodiments and the accompanying drawings are intended merely to clearly illustrate part of the technical spirit of the present invention, and it will be apparent to those skilled in the art that modifications and specific embodiments that those skilled in the art can easily derive from the present specification and the accompanying drawings are all included in the range of the rights of the present invention.

What is claimed is:

1. An envelope tracking power amplifier, comprising:
   a multi-mode bias modulator configured to generate a variable bias voltage using a linear amplifier and a switching amplifier operating in envelope tracking mode or average power tracking mode in accordance with an operation mode control signal that determines any one of the envelope tracking mode and the average power tracking mode; and
   a power amplifier configured to be biased in response to the variable bias voltage, and to power amplify a radio frequency (RF) signal and output the amplified RF signal to an antenna;
   wherein the multi-mode bias modulator:
   during operation in the envelope tracking mode, drives a linear amplification bias current corresponding to an alternating current (AC) component of an envelope signal using the linear amplifier, drives a switching amplification bias current corresponding to a direct current (DC) component of the envelope signal using the switching amplifier, and generates a variable bias current by combining the linear amplification bias current with the switching amplification bias current, and
   during operation in the average power tracking mode, generates the variable bias current by driving the switching amplification bias current following a predetermined reference voltage using the switching amplifier; and
   wherein the variable bias voltage is related to an output resistance of the multi-mode bias modulator, an input resistance of the power amplifier, and the variable bias current.

2. The envelope tracking power amplifier of claim 1, wherein the operation mode control signal is determined based on an average output power setting value, and the operation mode control signal is determined to be the average power tracking mode when the average output power setting value is relatively low and to be the envelope tracking mode when the average output power setting value is relatively high.

3. The envelope tracking power amplifier of claim 1, wherein:
   when operation mode is the envelope tracking mode in accordance with the operation mode control signal,
   the linear amplifier of the multi-mode bias modulator is operated to drive the linear amplification bias current using an operation amplifier that linearly amplifies the AC component of the envelope signal, and
   the switching amplifier of the multi-mode bias modulator is operated to drive the switching amplification bias current using a switching amplification stage that is switched in accordance with a first duty ratio determined based on a magnitude of the DC component of the envelope signal; and
   when the operation mode is the average power tracking mode in accordance with the operation mode control signal,
   the linear amplifier of the multi-mode bias modulator is operated to be inactivated, and
   the multi-mode bias modulator of the switching amplifier is operated to drive the switching amplification bias current using the switching amplification stage that is switched in accordance with a second duty ratio determined based on an error between the variable bias voltage, output by the multi-mode bias modulator, and the predetermined reference voltage.

4. The envelope tracking power amplifier of claim 1, further comprising an operation mode determination unit configured to detect a level of the variable bias voltage output by the multi-mode bias modulator, to determine any one of the average power tracking mode and the envelope tracking mode based on a result of comparison between the detected level of the variable bias voltage and a predetermined mode determination reference voltage, and to generate the operation mode control signal.

5. The envelope tracking power amplifier of claim 4, wherein the operation mode determination unit is operated to detect the level of the variable bias voltage output by the multi-mode bias modulator, to determine any one of the average power tracking mode and the envelope tracking mode based on a result of comparison between the detected level of the variable bias voltage and a predetermined mode determination reference hysteresis range, and to generate the operation mode control signal.

6. An envelope tracking power amplifier, comprising:
a multi-mode bias modulator configured to generate a variable bias voltage using a linear amplifier and switching amplifiers operating in envelope tracking mode or average power tracking mode in accordance with an operation mode control signal that determines any one of the envelope tracking mode and the average power tracking mode; and
a power amplifier configured to be biased in response to the variable bias voltage, and to power amplify a radio frequency (RF) signal and output the amplified RF signal to an antenna;
wherein the multi-mode bias modulator comprises:
the linear amplifier configured to drive a linear amplification bias current in accordance with an AC component of an envelope signal in the envelope tracking mode, and to be inactivated in the average power tracking mode;
a first switching amplifier configured to drive a first switching amplification bias current in accordance with a first duty ratio determined based on a magnitude of a DC component of the envelope signal in the envelope tracking mode, and to be inactivated in the average power tracking mode; and
a second switching amplifier configured to be inactivated in the envelope tracking mode, and to drive a second switching amplification bias current in accordance with a second duty ratio corresponding to an error between the variable bias voltage and a predetermined reference voltage in the average power tracking mode;
wherein the multi-mode bias modulator is operated to, during operation in the envelope tracking mode, generate a variable bias current by combining the linear amplification bias current output by the linear amplifier with the first switching amplification bias current output by the first switching amplifier and, during operation in the average power tracking mode, generate the variable bias current as the second switching amplification bias current that is current driven by the second switching amplifier; and
wherein the variable bias voltage is related to an output resistance of the multi-mode bias modulator, an input resistance of the power amplifier, and the variable bias current.

7. An envelope tracking power amplifier, comprising:
a multi-mode bias modulator configured to generate a variable bias voltage using a linear amplifier and a switching amplifier operating in envelope tracking mode or average power tracking mode in accordance with an operation mode control signal that determines any one of the envelope tracking mode and the average power tracking mode; and
a power amplifier configured to be biased in response to the variable bias voltage, and to power amplify a radio frequency (RF) signal and output the amplified RF signal to an antenna;
wherein the multi-mode bias modulator comprises:
the linear amplifier configured to drive a linear amplification bias current in accordance with an AC component of an envelope signal in the tracking mode, and to be inactivated in the average power tracking mode; and
the switching amplifier configured to drive a first switching amplification bias current corresponding to a DC component of the envelope signal in the envelope tracking mode, and to drive a second switching amplification bias current in accordance with a duty ratio corresponding to a magnitude of an error between the variable bias voltage and a predetermined reference voltage in the average power tracking mode;
wherein the multi-mode bias modulator is operated to, during operation in the envelope tracking mode, generate a variable bias current by combining the linear amplification bias current driven by the linear amplifier with the first switching amplification bias current driven by the switching amplifier and, during operation in the average power tracking mode, generate the variable bias current as the second switching amplification bias current that is driven by the switching amplifier; and
wherein the variable bias voltage is related to an output resistance of the multi-mode bias modulator, an input resistance of the power amplifier, and the variable bias current.

8. The envelope tracking power amplifier of claim 7, wherein:
the switching amplifier comprises a first comparator, a shooting current prevention and driving circuit unit, a switching amplification stage, an inductor, an error amplifier, a switch, a capacitor, and a second comparator; and
the switching amplifier is configured such that in accordance with the operation mode control signal:
during operation in the envelope tracking mode, an open loop, including the first comparator, the shooting current prevention and driving circuit unit, the switching amplification stage and the inductor, is activated and also the capacitor is separated from the inductor by the switch, thereby outputting the first switching amplification bias current, and
during operation in the average power tracking mode, a closed loop, including the error amplifier, the second comparator, the shooting current prevention and driving circuit unit, the switching amplification stage and the inductor, is activated and also the capacitor is connected to a contact between the inductor and the error amplifier by the switch, thereby driving the second switching amplification bias current.

9. The envelope tracking power amplifier of claim 8, wherein:
the switching amplifier is operated such that:
during operation in the envelope tracking mode, a comparison signal of the first comparator that compares a switching input signal of the linear amplifier with a reference voltage is applied to the shooting current prevention and driving circuit unit, and
during operation in the average power tracking mode, an error output is output by the error amplifier that amplifies the error between the variable bias voltage and the reference voltage and a PWM signal of the second comparator that compares the error output with a ramp signal is applied to the shooting current prevention and driving circuit unit; and the switching input signal is a class AB buffer output voltage attributable to a differential output signal pair of an operation amplifier of the linear amplifier.

10. The envelope tracking power amplifier of claim 9, wherein:
the switching amplifier comprises a first multiplexer and a second multiplexer that operate in accordance with the operation mode control signal;
the first multiplexer is operated to receive the ramp signal and the reference voltage, and to, during operation in the envelope tracking mode, select the reference voltage and then apply the reference voltage to the first comparator and, during operation in the average power tracking mode, select the ramp signal and then apply the ramp signal to the second comparator; and
the second multiplexer is operated to, during operation in the envelope tracking mode, apply the comparison signal, output by the first comparator, to the shooting current prevention and driving circuit unit and, during operation in the average power tracking mode, apply the PWM signal, output by the second comparator, to the shooting current prevention and driving circuit unit.

11. An envelope tracking power amplifier, comprising:
a multi-mode bias modulator configured to generate a variable bias voltage using a linear amplifier and a switching amplifier operating in envelope tracking mode or average power tracking mode in accordance with an operation mode control signal that determines any one of the envelope tracking mode and the average power tracking mode; and
a power amplifier configured to be biased in response to the variable bias voltage, and to power amplify a radio frequency (RF) signal and output the amplified RF signal to an antenna;
wherein the multi-mode bias modulator comprises:
the linear amplifier configured to drive a linear amplification bias current in accordance with an AC component of an envelope signal in the envelope tracking mode, and to be inactivated in the average power tracking mode; and
the switching amplifier configured to drive a first switching amplification bias current corresponding to a DC component of the envelope signal in the envelope tracking mode, and to generate a second switching amplification bias current in accordance with a duty ratio corresponding to a magnitude of an error between the variable bias voltage and a predetermined reference voltage in the average power tracking mode;
wherein the multi-mode bias modulator is operated to, during operation in the envelope tracking mode, generate a variable bias current by combining the linear amplification bias current output by the linear amplifier with the first switching amplification bias current output by the switching amplifier and, during operation in the average power tracking mode, generate the variable bias current as a second switching amplification bias current that is driven by the switching amplifier; and
wherein the variable bias voltage is related to an output resistance of the multi-mode bias modulator, an input resistance of the power amplifier, and the variable bias current.

12. The envelope tracking power amplifier of claim 11, wherein:
the switching amplifier comprises a first comparator, a shooting current prevention and driving circuit unit, a switching amplification stage, an inductor, a switch, and a capacitor and second comparator; and
the switching amplifier is configured such that in accordance with the operation mode control signal,
during operation in the envelope tracking mode, an open loop, including the first comparator, the shooting current prevention and driving circuit unit, the switching amplification stage and the inductor, is activated and also the capacitor is separated from the inductor by the switch, thereby outputting the first switching amplification bias current, and
during operation in the average power tracking mode, a closed loop, including the error amplifier, the second comparator, the shooting current prevention and driving circuit unit, the switching amplification stage and the inductor, is activated and also the capacitor is connected to a contact between the inductor and the error amplifier by the switch, thereby driving the second switching amplification bias current.

13. The envelope tracking power amplifier of claim 12, wherein:
the switching amplifier is operated such that:
during operation in the envelope tracking mode, a first comparison signal of the first comparator that compares a switching input signal of the linear amplifier with a reference voltage is applied to the shooting current prevention and driving circuit unit, and
during operation in the average power tracking mode, a second comparison signal of the second comparator that compares the variable bias voltage with the reference voltage is applied to the shooting current prevention and driving circuit unit; and
the switching input signal is a class AB buffer output voltage attributable to a differential output signal pair of an operation amplifier of the linear amplifier.

14. The envelope tracking power amplifier of claim 13, wherein:
the switching amplifier comprises a demultiplexer and a multiplexer that operate in accordance with the operation mode control signal;
the demultiplexer is operated to, during operation in the envelope tracking mode, apply the reference voltage to the first comparator and, during operation in the average power tracking mode, apply the reference voltage to the second comparator; and
the multiplexer is operated to, during operation in the envelope tracking mode, apply the first comparison signal of the first comparator to the shooting current prevention and driving circuit unit and, during operation in the average power tracking mode, apply the second comparison signal of the second comparator to the shooting current prevention and driving circuit unit.

* * * * *